United States Patent [19]

Pigeon et al.

[11] 4,287,288

[45] Sep. 1, 1981

[54] LITHOGRAPHIC PLATE OF TIN-PLATED STEEL AND METHOD OF MANUFACTURE

[75] Inventors: Marcel Pigeon, Neuilly sur Seine; Yannick de Maquille, Paris, both of France

[73] Assignee: Rhone-Poulenc-Graphic, Aubervilliers, France

[21] Appl. No.: 10,398

[22] Filed: Feb. 8, 1979

[30] Foreign Application Priority Data

Feb. 15, 1978 [FR] France ............................... 78 04213

[51] Int. Cl.3 .......................... G03F 7/08; G03F 7/10; G03C 1/74; B41N 1/10

[52] U.S. Cl. .................................... 430/169; 430/154; 430/166; 430/168; 430/275; 430/287; 430/302; 204/17; 204/41; 204/51

[58] Field of Search ........... 96/75, 86 P, 91 D, 115 R; 430/154, 157, 165, 166, 167, 168, 169, 302, 310, 323, 275, 287; 204/17, 41, 51

[56] References Cited

U.S. PATENT DOCUMENTS

| | | | |
|---|---|---|---|
| 2,429,107 | 10/1947 | Petren et al. | 96/86 R |
| 2,678,299 | 5/1954 | Geese et al. | 204/17 |
| 3,201,239 | 8/1965 | Neugebauer et al. | 96/75 |
| 3,348,948 | 10/1969 | Leonard et al. | 96/86 R |
| 3,478,684 | 11/1969 | Schafler et al. | 204/17 |
| 3,532,055 | 10/1970 | Wheeler | 96/91 D |
| 3,865,595 | 2/1975 | Watkinson | 96/75 |
| 3,873,316 | 3/1975 | Velten et al. | 96/86 R |
| 3,979,212 | 9/1976 | Peteus et al. | 96/86R |

FOREIGN PATENT DOCUMENTS

| | | | |
|---|---|---|---|
| 762992 | 7/1971 | Belgium . | |
| 1025244 | 4/1966 | United Kingdom | 96/75 |
| 1232395 | 5/1971 | United Kingdom . | |

OTHER PUBLICATIONS

Cartwright, H. M., "Ilford Graphic Arts Manual–vol. 2, Photolithography", Percy Lund et al., 1966, pp. 426–429.

Kosar, J., "Light-Sensitive Systems", J. Wiley & Sons, 1965, pp. 127–128.

*Primary Examiner*—Charles L. Bowers, Jr.

*Attorney, Agent, or Firm*—Sherman & Shalloway

[57] ABSTRACT

A method of making a presensitized lithographic plate is disclosed wherein a steel support having a tin-plated layer is depassivated and coated with a photosensitive product. Depassivation is accomplished by immersion of the support in an electrolytic bath of sodium carbonate. The electrolysis is performed with the support as a cathode and reversed so that the support is an anode of the bath. Preferably, the bath is an aqueous solution of 50 grams per liter of sodium carbonate at a temperature of 65° C. with a current density of the bath being approximately 2.5 amperes per $dm^2$. It is also contemplated that the depassivated tin-plated layer may be coated with copper before application of the photosensitive product. This can be accomplished by immersion in an electrolytic bath of copper cyanide. Preferably, the copper cyanide bath is at a temperature of 65° C. with immersion occurring for approximately 3 minutes with the support in the cathode position and having a current density of 2.5 amperes per $dm^2$. This results in a copper coating of approximately 3–4 microns in thickness. The copper coating may be passivated before the photosensitive product is added by a coating of aqueous benzotriazole solution.

The photosensitive product may be a diazo resin of the orthoquinone diazide type condensed with a formophenolic resin. Over the diazo resin, after development a firing solution which is subsequently annealed may be added. Alternatively, the depassivation of the tin-plated layer may be accomplished by wet brushing in the presence of an aqueous pounce solution followed by impregnation with a hydrochloric acid and stannous chloride solution.

Alternatively, a chromium layer may also be applied to the depassivated tin-plated layer before application of the photosensitive product. Such is accomplished in an electrolytic chromium bath containing chromic acid and sulfuric acid, the support being in a cathode position and the bath having a current density of approximately 20 amperes per $dm^2$. It is also contemplated that the photosensitive product may be a photopolymer of a cellulose acetate layer coated with a photopolymer. This results in a lithographic plate comprising oleophilic zones of a photopolymer or copper and hydrophilic zones of chromium or tin.

12 Claims, 3 Drawing Figures

LITHOGRAPHIC PLATE OF TIN-PLATED STEEL AND METHOD OF MANUFACTURE

BACKGROUND OF THE INVENTION

1. Field of the Invention

This invention generally relates to a lithographic plate having a tin-plated steel support and a process for preparing such a plate. In particular, the invention relates to the depassivation and electrolytic application of copper or chromium to a tin-plated steel support so that, after exposure and development, a lithographic plate having oleophilic zones of a photopolymer or copper and hydrophilic zones of chromium or tin may be created.

2. Description of the Prior Art

Lithographic printing plates now available on the market generally comprise either a stainless steel support or an aluminum support. For long-run plates, it is generally preferred to use stainless steel supports because of their high mechanical resistance and their ability to withstand a high number of impressions, on the order of several hundred thousands. However, a stainless steel support is an expensive support. Therefore, it often is preferred to use aluminum supports which are less expensive than stainless steel supports and which, in addition, have the advantage of being hydrophilic. However, these supports have a lower mechanical resistance as compared to steel supports and have a tendency to crack, which limits the number of impressions of a lithographic plate employing aluminum supports.

Use of lithographic plates of tin-plate is known from British Pat. No. 1,232,395. To make lithographic plates, the tin-plated support is coated with a photosensitive layer which, after selective exposure through an original, is stripped to make the tin selectively bare, which is etched until the underlying steel appears. The plate is then immersed in a copper-coating bath to copper coat the bare steel zones.

Finally, the photosensitive layer selectively protecting the tin is removed by a suitable developer. Thus, there is obtained a lithographic plate having a support of steel coated in the hydrophilic zones with a layer of tin and in the inkphilic (oleophilic) zones with a layer of copper.

This embodiment of a lithographic plate has several drawbacks:

Such a plate can only be copper-coated after having been exposed through the original to be reproduced, which inconveniently requires the presence of a copper-coating bath at the location of the printer performing the exposure and development. Further, immersion of the tin-plated support in the etching bath requires a protection for the tin layer on the back of the plate so that it will disappear and cause oxidation of the steel during use of the plate. Finally, cost factors require that the tin on the back of the plate must also be protected during the copper-coating operation to prevent depositing of copper on the back of the plate because of the high cost of this metal.

Another use of tin-plated steel as a lithographic plate support has been described in Belgian Pat. No. 762,992. The tin-plated steel is used as a polymetal lithographic plate because it makes it possible, according to the description of this patent, to obtain a sufficiently fine surface state. In this way, layers of copper and, then, of chromium deposited on the plate are free of surface defects. Thus, a steel support with a more or less controlled roughness can be used, the surface tin layer, optionally remelted, making it possible to obtain a support surface having a satisfactory condition for lithographic printing.

The problem encountered with the above-cited art is that it fails to disclose a tin-plated steel support and method of preparation for such a support which is simple, inexpensive and results in a hydrophilic lithographic plate.

SUMMARY OF THE INVENTION

A first object of the invention is to provide a presensitized lithographic plate, characterized in that it is comprised of a tin-plated steel support coated with either a photosensitive printing layer or a copper layer coated with a photosensitive varnish.

Another object of the invention is to provide a presensitized photosensitive plate of the type described above in which the hydrophilicity of the tin is reinforced by depositing a layer of crystalline chromium on the surface of the tin, the chromium having a thickness at least 0.3 microns.

It is another object of this invention to provide a support of tin-plated steel coated with chromium that forms a lithographic plate which can easily be corrected, after development, in the hydrophilic zones. Actually, if, during the correction operation performed on such a tin-plated steel support coated with chromium, the chromium layer is scraped so hard that it disappears, the underlying tin appears and its hydrophilicity makes it possible to use the plate thus corrected, which is not the case for lithographic plates in which the chromium is deposited on an inkphilic (oleophilic) metal or directly on the steel.

Another object of the invention is to provide a continuous process for making a hydrophilic support of a lithographic plate characterized in that it consists in taking a roll of tin-plated steel of the desired width, on which the layer has a thickness between 1 and 10 microns, unwinding the tin-plated steel, and for at least 10 seconds bringing it in contact with an electrolytic bath of an aqueous depassivation solution heated to more than 50° C., with a sodium carbonate base, rinsing the tin-plated steel in water, and neutralizing with a dilute aqueous sulfuric acid solution.

According to a preferred embodiment, the process according to the invention is characterized in that the tin-plated steel, after the above depassivation treatment, is immersed in a chromium-plating bath, the chromium-plating operation being performed without cutting off the current so that each part of the roll is in contact with the chromium-plating bath for a period of 2 to 8 minutes, the density of the current between the electrodes being on the order of 20 amperes per $dm^2$, the temperature of the chromium-plating bath being between 20° C. and 45° C. and preferably between 25° C. and 35° C., the tin-plate steel roll then being cut in plates of the desired length.

Another object of the invention is also to provide a lithographic plate comprising a steel support coated with hydrophilic zones and inkphilic (oleophilic) zones, characterized in that the support is obtained from a presensitized plate as defined above, the inkphilic zones being made up either of an inkphilic photopolymer or copper, while the hydrophilic zones are made up either of chromium or tin.

Tin-plated steel as a lithographic plate support actually offers numerous advantages: it has the resistance of steel, the hydrophilicity of tin and a particularly low cost, since it is mass produced for making tin cans.

Further, the tin provides a protection for the steel from corrosion which prevents the support from being attacked during the plate preparing operations.

Further, the mode of preparing the tin-plated steel by the electrolytic deposit of a tin layer, the unit being annealed, assures an exceptional adherence of the two metals to one another.

In a preferred embodiment of the invention, a support having a tin thickness between 1 and 10 microns, and preferably 2 to 6 microns, is employed. Actually, since tin is not a very hard metal, it is consequently advisable to limit its thickness.

It is contemplated that such a support may be used in the following ways:

considering the hydrophilic qualities of the tin, the support can be used directly coated with a photosensitive printing coating which actually makes a very inexpensive plate;

the support can also be copper-coated by electrolysis and coated with a photosensitive layer. After development, etching and reversal, the plate is ready to use. Use of such a support of tin-plated steel, in which the tin is plated over and protects the steel, makes it possible to deposit a copper layer 2 microns thick, The advantage of such polymetal plates is the notably reduced manufacture cost for an equal quality plate;

to reinforce the hydrophilicity of the tin layer, a preferred embodiment contemplates a deposit of a chromium layer on the support. It has been found, in a surprising way, that the chroming operation can be performed without cutting off the current while obtaining a perfectly hydrophilic (dull) chromium. For this, it will be preferable to use a chromium bath whose temperature will be between 20° C. and 45° C., and preferably 25° C. to 35° C. The thickness of the chromium layer should be greater than 0.3 micron, thereby improving the hydrophilicity of the support. This provides a considerable advantage over the prior art in that the current cutoff during the chromium-plating operation is eliminated, i.e., this operation can be performed continuously on the tin-plated steel, generally available in very long rolls.

This feature, as well as others, can be appreciated by referring to the exhibits in which:

FIG. 1 is a 10,000 magnification enlargement of a layer of chromium deposited on a tin-plated steel substrate, the chromium plating occurring by electrolysis for 5 minutes with one current interruption;

FIG. 2 is a 10,000 magnification enlargement of a layer of chromium deposited on a tin-plated steel substrate, the chromium plating occurring by electrolysis for 7 minutes without current interruption; and FIG. 3 is a 3,000 magnification enlargement of a layer of chromium deposited on a tin-plated steel substrate, the chromium plating occurring by electrolysis for 30 seconds without current interruption.

DETAILED DESCRIPTION OF THE INVENTION

Figure 1:
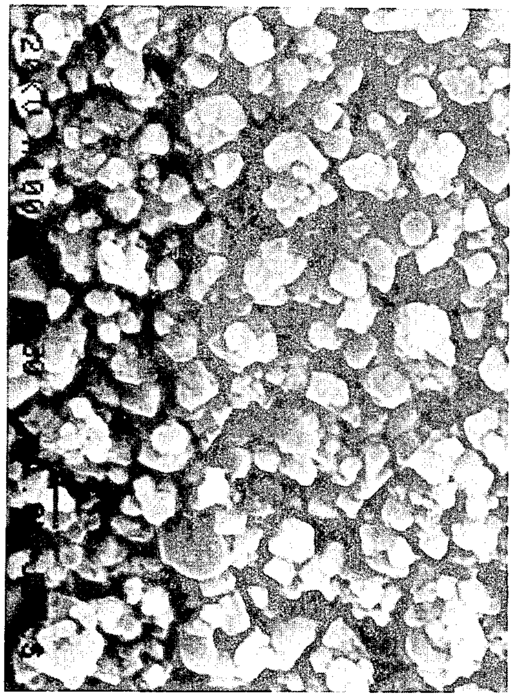

The basis of the invention is a lithographic plate comprised of a steel support with a flat surface which is used for printing purposes. The flat surface is tin-plated and a photosensitive product is applied to and coated over the tin-plated layer. It is contemplated that the lithographic plate of the invention may be made from a roll of tin-plated steel having the desired width so that th. process of making the presensitized lithographic plate may be continuously performed as the roll of steel is unwound. Alternatively, a chromium layer or a copper layer may be applied to the tin-plated layer before application of the photosensitive product. Thus, after exposure and development of the presensitized lithographic plate of the invention, inkphilic (oleophilic) zones of a photopolymer or copper and hydrophilic zones of chromium or tin can be formed on the lithographic plate.

When employing chromium, a chromium layer is applied in an electrolytic chromium bath which is preferably at 30° C. and containing a supply of chromium, such as a solution of chromic acid and sulfuric acid. During electrolysis, the support forming the lithographic plate is placed in the cathode position and the bath is controlled to have a current density of approximately 20 amperes per $dm^2$. After an anchoring treatment to prevent greasing, the plate may then be coated with a photosensitive product, for example, a condensation product of an orthoquinone diazide and a phenol-formaldehyde resin. Alternatively, the photosensitive product may be a cellulose acetate layer subsequently coated with a layer of a photopolymer. It can, therefore, be appreciated that the lithographic plate, as prepared above, results in oleophilic zones of the photosensitive product and hydrophilic zones of the chromium coating after exposure and development.

In general, for the chromium to have a good hydrophilicity so that it may be employed as a hydrophilic zone, it is necessary that the chromium be deposited in the crystalline state, i.e., in the form of a lattice of solid crystals between which cavities exist. The appearance of such a chromium is dull. Contrary to chromium of a non-crystalline type with a brilliant appearance in which there does not exist a lattice of crystals separated by cavities, the dull chromium is very hydrophilic and very well suited for making hydrophilic metal supports for lithographic plates. Moreover, it provides excellent adherence for inkphilic layers.

With all the "standard" supports used in lithography, such as steel, stainless steel, brass, etc., the depositing of chromium by passage in an electrolytic chroming bath gives rise to a brilliant chromium. One technique to prevent a brilliant layer consists of dipping the support in an electrolytic chromium bath and, after some minutes of electrolysis, interrupting the current. After less than a minute of interruption, the current is re-established. The result is a surface chromium layer having a dull appearance and excellent hydrophilic properties. The drawback of such a process is the necessity of performing the chromium application plate by plate, the continuous production in combination with current interruption being difficult and requiring complex equipment.

It has been found that the invention permits tin-plated steel to be chromed to obtain dull, hydrophilic chromium without interrupting the current. Actually, this invention is completely unexpected and contrary to the teaching of present technique of interrupting the current during the chromium-plating operation. In fact, employing interruption in combination with the invention does not make any improvement in the chromium layer.

Figure 2:
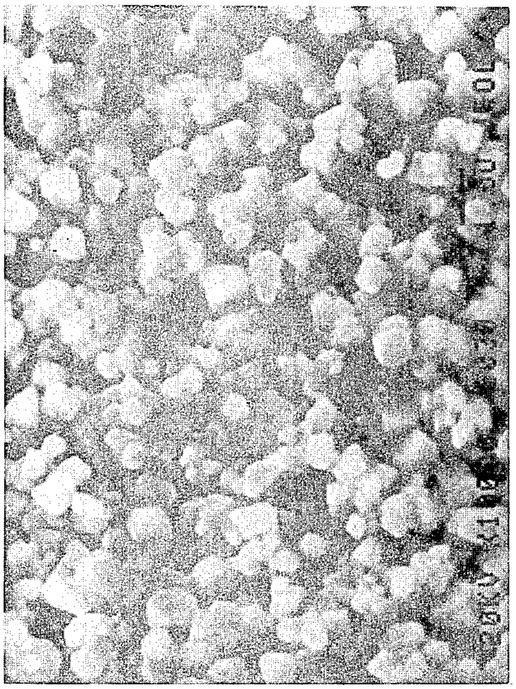
Figure 3:
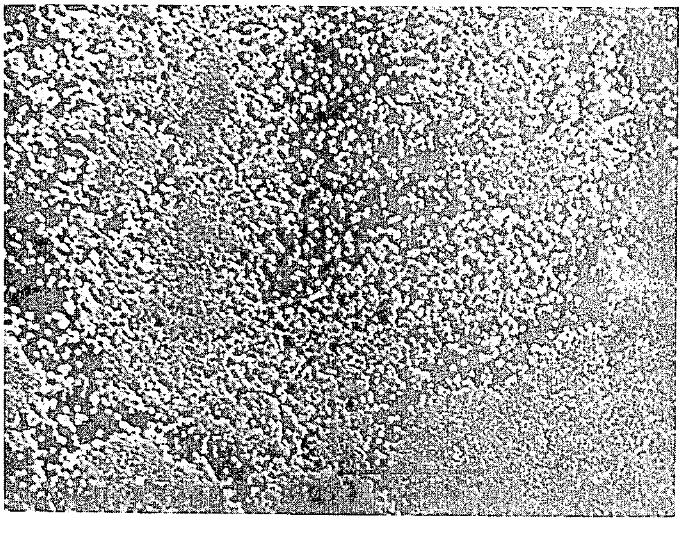

This can be appreciated by comparing FIGS. 1 and 2; the interruption of current during electrolysis does not affect the crystalline structure of a chromium layer deposited on a tin-plated steel substrate. It is also clear on FIG. 3 that the crystalline structure occurs on the tin-plated substrate at the beginning the chromium electrolysis process of the invention.

One important feature of the invention is that, before performing one of the operations of copper-coating, chromium-plating or deposit of a photosensitive printing layer on the support of tin-plated steel, a depassivation treatment is applied to the support according to the invention. For this, it suffices to perform either a wet or drying brushing of the support or to immerse the plate into an electrolytic bath of sodium carbonate. In this latter case, it is then advisable to neutralize the plate by immersion in a dilute solution of sulfuric acid.

When using an electrolytic bath of sodium carbonate to depassivate the tin-plated layer, the electrolysis is initially performed with the steel support as a cathode in the electrolytic bath, and then subsequently performed with the steel support as an anode in the electrolytic bath. Preferably, an aqueous solution of 50 grams per liter of sodium carbonate at a temperature of approximately 65° C. is employed in the electrolytic bath and a current density of 2.5 amperes per $dm^2$ is applied.

It is also possible to apply directly to the tin-plated steel substrate a layer of copper by immersing the depassivated tin-plated layer in an electrolytic bath of copper cyanide. Similarly, the copper cyanide bath should be at a temperature of approximately 65° C. with the support immersed for approximately 3 minutes in a cathode position. With a current density in the electrolytic copper cyanide bath of approximately 2.5 amperes per $dm^2$, a layer of copper approximately 3–4 microns in thickness can be achieved. The copper coating may be passivated by application of an aqueous benzotriazole solution before the copper is finally coated with a photosensitive product. A diazo resin as noted above is contemplated as one embodiment of the photosensitive product employed with the copper coating.

In addition, a firing solution may be applied after development over the plate and subsequently annealed.

The invention will be better understood from the following examples of embodiments, provided in a non-limiting way:

EXAMPLE 1

A tin-plated steel plate, referenced $E_3$ "fine ground" finished, of the Usinor-Mardyk Company, was made to undergo the following treatment:

immersion for 15 seconds of the plate in the cathode position (anode of graphite) in an aqueous solution of sodium carbonate (50 grams per liter) brought to a temperature of 65° C. the density of the current between anode and cathode being 2.5 amperes per $dm^2$.

The same operation was then begun again, under the same conditions, by placing the plate in the anode position with a graphite cathode. The support was then rinsed and neutralized by immersion for 10 seconds in an aqueous solution of sulfuric acid (10 grams per liter) at a temperature of 20° to 25° C.

After rinsing with water, copper-coating of the support was performed in a bath of the following composition:

CuCN: 40 grams per liter
free NaCN: 8 grams per liter
NaOH: 8 grams per liter
$Na_2CO_3$: 40 grams per liter
Rochelle salt (potassium sodium tartrate): 30 grams per liter The bath temperature being around 65° C., the plate was immersed for 3 minutes, in the cathode position, the current density through the plate being about 2.5 amperes per $dm^2$. The thickness of the layer deposited was about 2–3 microns.

The adherence of the copper to the tin was good. After dry or wet sanding (such as pouncing), the copper was passivated with a benzotriazole solution (10 grams per liter in water). The resulting plate was coated with a diazo resin of the orthoquinone diazide type condensed with a formophenolic resin (Novolak), (see, for example, French Pat. No. 1,031,581, which relates to these photosensitive products and their use on lithographic plates).

After exposure and development, the copper was etched with a base solution of ammonium persulfate (or any other powerful oxidant, such as sodium hypobromite, etc.) and excess ammonia.

Then, reversal was performed with a solution containing 80% by weight of ethylglycol and 20% butyldiglycol. The resulting plate was locked in the machine and after 10,000 impressions, the impressions were still of good quality.

EXAMPLE 2

A plate, depassivated and then neutralized as in Example 1, was directly coated with a layer of diazo resin described above. After exposure and development, the plate was coated with a firing solution QM 888, antiscumming surfactant, sold by La Cellophane. The plate was then annealed for 8 minutes at 260° C. in a pulsed dry air oven of the Wisconsin Oven Corp. After 25,000 impressions, the plate was still in good condition.

EXAMPLE 3

A plate was prepared according to Example 2 with firing at 150° C. for 10 minutes. After 10,000 impressions in a locked press, the plate was still functional.

EXAMPLE 4

A plate prepared according to Example 2 with firing at 200° C. for 8 minutes was locked into the press. After 15,000 impressions, the plate was still providing quality performance.

Examples 2, 3 and 4 show that the firing temperature has an influence on the hardness of the layer: the melting temperature of tin being 232° C., firing above this temperature has a good influence on the adherence of the photosensitive layer.

EXAMPLE 5

A tin-plated steel support as described in Example 1 was used. Depassivation of the tin was performed by wet brushing of the plate, the operations being performed under the following conditions: the plate was subjected to the action of brushes of the "Strips in corrugated white Tinex" type sold by the Univers Company, each fiber of the brush having a thickness on the order of 30/100 mm and a length of 45 mm, said brushes being fastened helicoidally on a shaft rotating at an angle on the order of 50°, at a rate of 35 brushes per shaft. The brushes were in contact with the plate. The shaft rotation speed was on the order of 500 rpm. The brushing was performed in the presence of an aqueous pounce solution of the "Pumex 4/O B" type (75 grams per liter) (pulverised pummice) containing 7.5 grams per liter trisodium phosphate. After rinsing, the plate was rubbed for 30 seconds with a pad impregnated with a solution containing 10% by volume of HCl and 6% stannous chloride. After rinsing, a layer of photopolymer PE 4125 (cinnamylidene resin) of the Kodak Company was deposited at a rate of 3 g/m$^2$. After exposure, development and then gumming, the plate was coated with firing solution QM 888 and placed in an oven at 200° C. for 10 minutes. After locking in the press, the appearance of some small pits of the photopolymer layer was noted after 12,500 impressions.

EXAMPLE 6

A tin-plated steel support having undergone the depassivation treatment of Example 1 was used. The plate was then chromium-plated in a chromium bath at 30° C. containing 250 grams per liter of chromic acid and 2.5 grams per liter of sulfuric acid. The plate was in the cathode position, the other electrode (anode) being hard lead. The current density between electrodes was on the order of 20 amperes per dm$^2$. Depending on the thickness of chromium desired, the chroming period can vary from 2–8 minutes, without interrupting the current. After anchoring treatment to prevent greasing, the plate was then coated with a layer of diazo resin as described above.

After preparation, the plate was gummed for 10 minutes. After 25,000 impressions, no change in the plate was noted, the copy being of good quality.

EXAMPLE 7

A plate was made according to Example 6 by performing chroming with a 20 second interruption of the current.

No improvement in the quality of the copy or resistance of the plate to wear was noted.

EXAMPLE 8

A plate according to Example 6 was made by replacing the diazo resin layer with a cellulose acetate layer and then a layer of photopolymer PE 4125 of the Kodak Company, according to Example 1 of French application No. 77 14 489 titled "New Photopolymer Base Lithographic Plates and Processes of Use", filed May 12, 1977 in the name of La Cellophane. The same results as in Example 6 above were obtained.

What is claimed is:

1. A continuous method of making a presensitized lithographic plate from a tin-plated steel support wherein the tin-plate is a layer having a thickness in the range of from 1 to 10 microns comprising the steps of:

(a) depassivating the tin layer, (b) continuously plating the depassivated tin layer of the tin-plated steel support in an electrolytic chromium bath having a temperature in the range of from 20° C. to 45° C. without cutting off the current in the electrolytic chromium bath to thereby obtain a hydrophilic dull chromium layer, and (c) coating the hydrophilic chromium layer with a photosensitive product capable of being made oleophilic by photoexposure and development.

2. The method of claim 1 wherein the temperature of the electrolytic chromium bath is in the range of from 25° C. to 35° C.

3. The method of claim 1 wherein the plating step (b) is performed in an electrolytic bath at a temperature of about 30° C. containing 250 grams per liter of chromic acid and 2.5 grams per liter of sulfuric acid, the tin-plated steel support being in the cathode position and the bath having a current density of about 20 amperes per dm$^2$.

4. The method of claim 1 wherein the photosensitive product is a condensation product of a orthoquinone diazide and a phenol-formaldehyde resin.

5. The method of claim 1 wherein the step (d) of coating with the photosensitive product comprises the steps of coating the chromium layer followed by coating with a cinnamylidene malonate resin.

6. The method of claim 1 wherein the plating of the depassivated tin layer is performed to provide a thickness of the chromium layer of at least 0.3 micron.

7. The method of claim 1 wherein said depassivating step (a) includes the step of immersing the tin-plated steel support in an electrolytic bath of sodium carbonate.

8. The method of claim 7 wherein said immersing is performed with the tin-plated steel support as the cathode in the electrolytic bath.

9. The method of claim 8 wherein said immersing is subsequently performed with the tin-plated steel support as an anode in the electrolytic bath, said bath comprising an aqueous solution of 50 grams per liter of sodium carbonate at a temperature of about 65° C. and wherein the current density of the electrolytic bath is about 2.5 amperes per dm$^2$.

10. The method of claim 1 wherein the depassivating step (a) is performed by wet brushing of the tin-plated layer in the presence of an aqueous pounce solution.

11. The method of claim 10 wherein the wet brushed layer is treated with hydrochloric acid and stannous chloride.

12. The method of claim 1 wherein the photosensitive product is a photosensitive polymer composition.

* * * * *